(12) United States Patent
Kubo et al.

(10) Patent No.: US 11,832,524 B2
(45) Date of Patent: Nov. 28, 2023

(54) METHOD FOR PROCESSING SUBSTRATE, PROCESSING APPARATUS, AND PROCESSING SYSTEM

(71) Applicant: Tokyo Electron Limited, Tokyo (JP)

(72) Inventors: Takuya Kubo, Tokyo (JP); Song yun Kang, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 481 days.

(21) Appl. No.: 17/264,213

(22) PCT Filed: Jul. 30, 2019

(86) PCT No.: PCT/JP2019/029885
§ 371 (c)(1),
(2) Date: Jan. 28, 2021

(87) PCT Pub. No.: WO2020/027152
PCT Pub. Date: Feb. 6, 2020

(65) Prior Publication Data
US 2022/0115589 A1 Apr. 14, 2022

(30) Foreign Application Priority Data
Jul. 30, 2018 (JP) .................. 2018-142317

(51) Int. Cl.
*H01L 21/00* (2006.01)
*H10N 50/01* (2023.01)
*H01J 37/34* (2006.01)

(52) U.S. Cl.
CPC ......... *H10N 50/01* (2023.02); *H01J 37/3476* (2013.01); *H01J 2237/332* (2013.01); *H01J 2237/334* (2013.01)

(58) Field of Classification Search
CPC ........ H10B 61/22; H10B 63/30; H10B 61/00; H10B 99/00; H10B 63/82; H10B 63/20;
(Continued)

(56) References Cited

U.S. PATENT DOCUMENTS 9,123,879 B2 * 9/2015 Nakayama ............ H10B 61/00
2010/0184239 A1 * 7/2010 Matsuzaki ............ H10N 50/10
216/22
(Continued)

FOREIGN PATENT DOCUMENTS

JP 07-263420 A 10/1995
JP 2004-247584 A 9/2004
(Continued)

OTHER PUBLICATIONS

International Search Report for PCT/JP2019/029885, dated Oct. 29, 2019, 2 pages.

*Primary Examiner* — Niki H Nguyen
(74) *Attorney, Agent, or Firm* — Armstrong Teasdale LLP

(57) ABSTRACT

A method of processing a substrate includes a first step, a second step and a third step. The substrate includes an etching layer and a mask. The mask is formed on a first surface of the etching layer. The first step forms a first film on a second surface of the mask. The second step forms a second film having a material of the etching layer on the first film by etching the first surface of the etching layer. The third step removes the first film and the second film by exposing the substrate after the second step to plasma of a processing gas. The first film has an electrode material. The processing gas includes oxygen.

10 Claims, 6 Drawing Sheets

(58) Field of Classification Search
CPC ........ H10B 63/22; H10B 63/24; H10B 63/32; H10B 10/00; H10B 53/00; H10B 61/10; H10B 12/03; H10B 12/033; H10B 12/0335; H10B 12/053; H10B 12/34; H10B 12/50; H10B 41/30; H10B 63/00; H10N 50/01; H10N 50/10; H01J 37/3476; H01J 2237/332; H01J 2237/334; H01L 21/3065; H01L 21/31144; H01L 21/31116; H01L 21/0273; H01L 21/027; H01L 21/0337; H01L 21/0274; H01L 27/105; H01L 21/31138; H01L 21/311; H01L 21/31055; H01L 21/31056; H01L 21/31058; H01L 21/32136; H01L 21/0332; H01L 21/32137; H01L 21/67207; H01L 21/6835; H01L 21/31122; H01L 2221/68381; H01L 2221/68368; H01L 2221/6835; H01L 2224/18; H01L 2224/24137; H01L 2224/73267; H01L 2224/92244

See application file for complete search history.

(56) References Cited

U.S. PATENT DOCUMENTS

| | | |
|---|---|---|
| 2012/0139019 A1 | 6/2012 | Iba |
| 2015/0029779 A1* | 1/2015 | Lee ..................... H10N 70/841 257/421 |
| 2016/0351798 A1* | 12/2016 | Shen ..................... H10N 50/01 |

FOREIGN PATENT DOCUMENTS

| | | |
|---|---|---|
| JP | 2005-268252 A | 9/2005 |
| JP | 2010-103224 A | 5/2010 |
| JP | 2010-165980 A | 7/2010 |
| JP | 2012-119564 A | 6/2012 |

* cited by examiner

METHOD FOR PROCESSING SUBSTRATE, PROCESSING APPARATUS, AND PROCESSING SYSTEM

CROSS-REFERENCE TO RELATED APPLICATIONS

This application is a National Stage Application of International Patent Application No. PCT/JP2019/029885, having an International Filing Date of Jul. 30, 2019, which claims the benefit of priority to Japanese Patent Application No. 2018-142317, filed Jul. 30, 2018, the entire contents of each of which are hereby incorporated by reference herein.

TECHNICAL FIELD

Exemplary embodiments of the present disclosure relate to a substrate processing method, a processing apparatus, and a processing system.

BACKGROUND

Patent Document 1 discloses a technique related to a plasma processing method and a plasma processing apparatus. The technique disclosed in Patent Document 1 is a method of performing, by using a mask, a plasma etching process on each layer of a laminated body formed by sequentially laminating a first layer formed of a conductor made of a hard-to-etch material, a second layer formed of an insulator, and a third layer formed of a conductor.

PRIOR ART DOCUMENTS

Patent Documents

Patent Document 1: Japanese laid-open publication No. 2004-247584

SUMMARY

The present disclosure provides some embodiments of a technique capable of improving etching processing accuracy.

In one exemplary embodiment, there is provided a method of processing a substrate. The substrate includes an etching layer and a mask. The mask is formed on a first surface of the etching layer. The method includes a first step, a second step and a third step. The first step forms a first film on a second surface of the mask. The second step forms a second film having a material of the etching layer on the first film by etching the first surface of the etching layer. The third step removes the first film and the second film by exposing the substrate after the second step to plasma of a processing gas. The first film has an electrode material. The processing gas includes oxygen.

According to the present disclosure, it is possible to improve etching processing accuracy.

DETAILED DESCRIPTION

Figure 1:
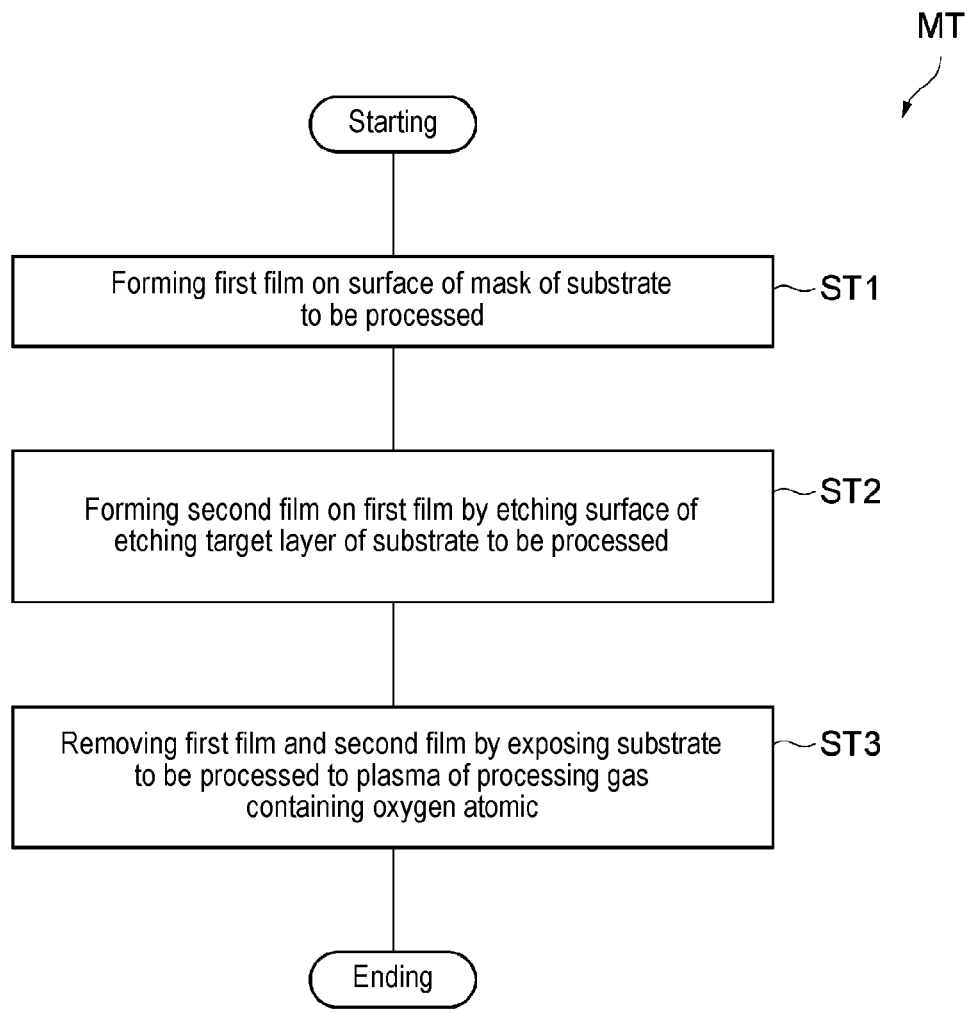
FIG. 1 is a diagram illustrating a method according to an exemplary embodiment of the present disclosure.

Various exemplary embodiments will now be described. In one exemplary embodiment, a method of processing a substrate is provided. The substrate includes an etching layer and a mask. The mask is formed on a first surface of the etching layer. This method includes a first step, a second step, and a third step. In the first step, a first film is formed on a second surface of the mask. In the second step, a second film having a material of the etching layer is formed on the first film by etching the first surface of the etching layer. In the third step, the first film and the second film are removed by exposing the substrate after the second step to plasma of a processing gas. The first film has an electrode material. The processing gas includes oxygen.

According to the exemplary embodiment described above, the first film of the electrode material can be appropriately delaminated from the second surface of the mask together with the second film deposited on the first film and having the material of the etching layer by exposing the substrate to the plasma of the processing gas containing oxygen. Therefore, in the etching of the etching layer, a change in critical dimension (CD) of mask shape can be sufficiently suppressed while sufficiently maintaining a mask residual film. Thus, it is possible to avoid a situation in which the film containing the material of the etching layer is formed on the second surface of the mask by the etching of the etching layer, which makes fine etching process difficult.

In one exemplary embodiment, the etching layer includes an electrode material layer. The electrode material layer extends to the first surface. In the first step, the first film is formed by etching the electrode material layer and sputtering the material of the electrode material layer. As described above, it may be considered that the electrode material layer extends to the first surface of the etching layer. In this case, the formation of the first film of the electrode material is performed by the etching of the etching layer, and thus etching of the etching layer and the formation of the first film are performed together in the first step. Thus, it is possible to simplify the processing.

In one exemplary embodiment, in the first step, the first film is formed by chemical vapor deposition or physical vapor deposition. As described above, since the first film can be formed through a film forming process by the chemical vapor deposition or the physical vapor deposition, the timing of the formation of the first film can be relatively flexibly adjusted.

In one exemplary embodiment, a series of steps including the first step, the second step, and the third step are repeatedly executed. Thus, the maintenance of the mask residual film and the suppression of the change in the CD of mask shape can be more remarkably realized.

In one exemplary embodiment, the etching layer includes a magnetic tunnel junction region. Although the magnetic tunnel junction region has a hard-to-volatile material, the exemplary embodiment described above may be applied to an etching layer having the magnetic tunnel junction region of the hard-to-volatile material.

In one exemplary embodiment, the first film has an electrode material of ruthenium or carbon. As described above, since the ruthenium or carbon electrode material can be used as the electrode material of the first film, the formation of the first film is relatively easily performed.

In one exemplary embodiment, a processing apparatus for processing a substrate is provided. The processing apparatus includes a processing container configured to accommodate a substrate and a controller configured to control the processing apparatus. The controller includes a first film forming part, a second film forming part, and a film removing part. The first film forming part is configured to control the processing apparatus so as to form a first film having an electrode material on a second surface of a mask when the substrate accommodated in the processing container includes an etching layer and the mask and the mask is formed on a first surface of the etching layer. The second film forming part is configured to control the processing apparatus so as to form a second film having the material of the etching layer on the first film by etching the first surface of the etching layer after the formation of the first film by the first film forming part. The film removing part is configured to control the processing apparatus so as to remove the first film and the second film by exposing the substrate on which the second film is formed by the second film forming part to plasma of a processing gas having oxygen.

According to the exemplary embodiment described above, the first film of the electrode material can be appropriately delaminated from the second surface of the mask together with the second film deposited on the first film and having the material of the etching layer by exposing the substrate to the plasma of the processing gas containing oxygen. Therefore, in the etching of the etching layer, the change in the CD of mask shape can be sufficiently suppressed while sufficiently maintaining the mask residual film. Thus, it is possible to avoid a situation in which the film containing the material of the etching layer is formed on the second surface of the mask by the etching of the etching layer, which makes fine etching processing difficult.

In one exemplary embodiment, when the etching layer includes an electrode material layer and the electrode material layer extends to the first surface, the first film forming part is configured to control the processing apparatus so as to form the first film by etching the electrode material layer and sputtering the material of the electrode material layer. As described above, it may be considered that the electrode material layer extends to the first surface of the etching layer. In this case, the first film of the electrode material is formed by the etching of the etching layer, and the etching of the etching layer and the formation of the first film are performed together by the first film forming part. Thus, it is possible to simplify the processing.

In one exemplary embodiment, a processing system for processing a substrate is provided. The processing system includes a film forming apparatus configured to perform a film forming process on the substrate, an etching apparatus configured to perform an etching process on the substrate, and a controller configured to control the processing system. The controller includes a first film forming part, a second film forming part, and a film removing part. The first film forming part is configured to control the processing system so as to form a first film having an electrode material on a second surface of a mask when the substrate accommodated in the film forming apparatus includes an etching layer and the mask and the mask is formed on a first surface of the etching layer. The second film forming part is configured to control the processing system so as to form a second film having the material of the etching layer on the first film by transferring the substrate to the etching apparatus and etching the first surface of the etching layer after the formation of the first film by the first film forming part. The film removing part is configured to control the processing system so as to remove the first film and the second film by exposing the substrate on which the second film is formed by the second film forming part to plasma of a processing gas having oxygen.

According to the exemplary embodiment described above, the first film of the electrode material can be appropriately delaminated from the second surface of the mask together with the second film formed on the first film and having the material of the etching layer by exposing the substrate to the plasma of the processing gas containing oxygen. Therefore, in the etching of the etching layer, the change in the CD of mask shape can be sufficiently suppressed while sufficiently maintaining the mask residual film. Thus, it is possible to avoid a situation in which the film containing the material of the etching layer is formed on the second surface of the mask by the etching of the etching layer, which makes fine etching processing difficult.

In one exemplary embodiment, the first film forming part is configured to control the processing system to form the first film by chemical vapor deposition or physical vapor deposition. As described above, since the first film can be formed by the film forming process by the chemical vapor deposition or the physical vapor deposition, the timing of formation of the first film may be relatively flexibly adjusted.

Figure 2:
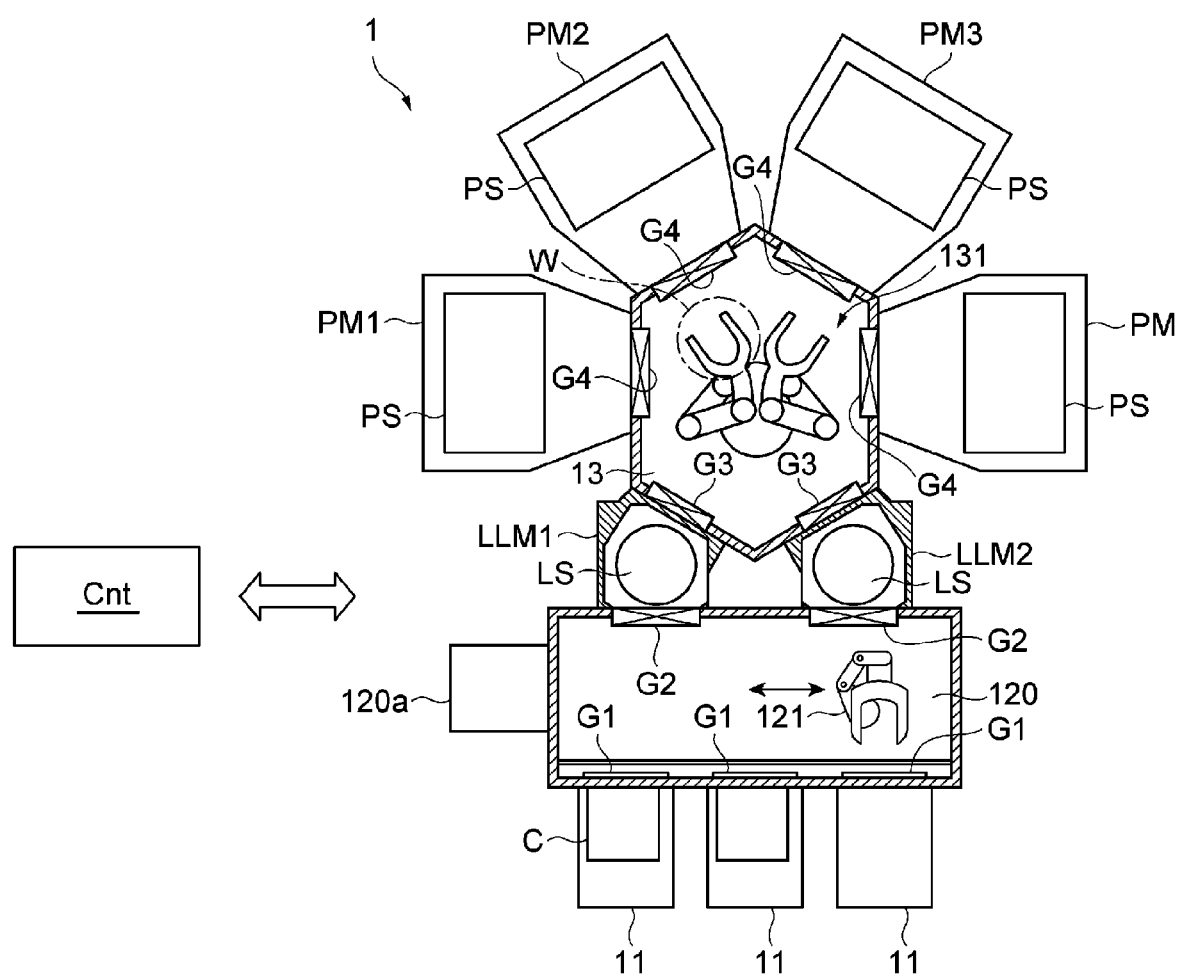
FIG. 2 is a view illustrating a processing system according to an exemplary embodiment of the present disclosure.

Hereinafter, various exemplary embodiments will be described in detail with reference to the drawings. Further, like or equivalent parts in each drawing will be denoted by like reference numerals. A method MT illustrated in FIG. 1 is an exemplary embodiment of a method of processing a substrate. The method MT may be performed by a processing system 1 illustrated in FIG. 2.

First, a configuration of the processing system 1 according to an exemplary embodiment of the present disclosure will be described with reference to FIG. 3. The processing system 1 may be used to perform the method MT illustrated in FIG. 1.

The processing system 1 includes carrier mounting ports 11, an atmospheric transfer chamber 120, a load lock module LLM1, and a load lock module LLM2. The processing system 1 further includes a vacuum transfer chamber 13, a processing module PM1, a processing module PM2, a processing module PM3, and a processing module PM4.

The atmospheric transfer chamber 120 and the load lock module LLM1 and the load lock module LLM2 are connected to each other via door valves G2 while maintaining airtightness. The load lock module LLM1 and the load lock module LLM2 and a transfer arm 131 are connected to each other via gate valves G3 while maintaining airtightness. The transfer arm 131 and the processing modules PM1 to PM4 are connected to each other via gate valves G4 while maintaining airtightness.

Transfer vessels C are mounted on the carrier mounting ports 11. The carrier mounting ports 11 correspond to loading ports of the transfer vessels C. The transfer vessels C accommodate a plurality of substrates W. The transfer vessels C are connected to the atmospheric transfer chamber 120 via doors G1.

The atmospheric transfer chamber 120 transfers the substrates W discharged from the transfer vessels C under an atmospheric atmosphere. A transfer arm 121 is provided in the atmospheric transfer chamber 120. The transfer arm 121 can freely rotate, expand and contract, ascend and descend, and move left and right.

The transfer arm 121 discharges the substrates W one by one from the transfer vessel C and transfers the discharged substrates W. An alignment chamber 120a is provided on a side surface of the atmospheric transfer chamber 120. The alignment chamber 120a incorporates an orienter for aligning the substrates W therein.

Each of the load lock module LLM1 and the load lock module LLM2 is connected to the atmospheric transfer chamber 120 via each of the door valves G2. Both the load lock module LLM1 and the load lock module LLM2 switch their respective internal states between an air atmosphere and a preliminary vacuum atmosphere and standby the substrates W. Both the load lock module LLM1 and the load lock module LLM2 are arranged so as to connect between the atmospheric transfer chamber 120 and the vacuum transfer chamber 13.

A vacuum pump and a leak valve are connected to each of the load lock module LLM1 and the load lock module LLM2. The vacuum pump and the leak valve switch the interior of each of the load lock module LLM1 and the load lock module LLM2 between the air atmosphere and the vacuum atmosphere.

A stage LS is provided in each of the load lock module LLM1 and the load lock module LLM2. The stage LS places the loaded substrate W thereon.

The vacuum transfer chamber 13 is connected to each of the load lock module LLM1 and the load lock module LLM2 via each of the gate valves G3. The vacuum transfer chamber 13 transfers the substrate W in a vacuum atmosphere.

The processing modules PM1 to PM4 are connected to the vacuum transfer chamber 13 via the respective gate valves G4. A vacuum pump (not shown) for keeping the interior of the vacuum transfer chamber 13 in a vacuum atmosphere is connected to the vacuum transfer chamber 13.

The transfer arm 131 is provided in the vacuum transfer chamber 13. The transfer arm 131 may be configured to be rotatable and extendible. The transfer arm 131 transfers the substrate W between the load lock module LLM1 and the load lock module LLM2 and the processing modules PM1 to PM4.

All the processing modules PM1 to PM4 perform a processing on the substrate W. Each of the processing modules PM1 to PM4 includes a processing container PS configured to accommodate the substrate W. The processing is performed on the substrate W accommodated in the processing container PS. The processing may be, for example, an etching process, a film forming process, or the like.

Each of the processing modules PM1 to PM4 can perform, for example, different kinds of processing on the substrate W.

In one embodiment, for example, the processing module PM1 may be a film forming apparatus configured to perform the film forming process on the substrate W loaded into the processing container PS. In this case, the processing module PM1 (film forming apparatus) may be a plasma processing apparatus 10 illustrated in FIG. 3.

In one embodiment, for example, the processing module PM2 may be an etching apparatus configured to perform an etching process on the substrate W loaded into the processing container PS. In this case, the processing module PM2 (etching apparatus) may be the plasma processing apparatus 10 illustrated in FIG. 3.

The processing system 1 includes a controller Cnt. The controller Cnt is configured to comprehensively control the operations of the respective parts of the processing system 1 (the transfer arm 121, the processing modules PM1 to PM4, and the like illustrated in FIG. 2).

The controller Cnt may be physically configured as a computer device including a processor, a memory, a storage, a communication device, a bus, and the like (not shown). The processor of the controller Cnt includes a CPU, a memory, and the like.

The operations of the respective parts of the processing system 1 are implemented by causing the processor to read a computer program stored in the storage or the like (for example, a program that executes the method MT illustrated in FIG. 1) in the processor and the memory and execute the computer program.

A processing operation of the substrate W by the processing system 1 described above will be schematically described. The substrate W accommodated in the transfer vessel C on the carrier mounting ports 11 is picked up by the transfer arm 121 and is arranged in the alignment chamber 120a while being transferred in the atmospheric transfer chamber 120. After this alignment, the substrate W are transferred into either the load lock module LLM1 or the load lock module LLM2.

After the substrate W is transferred into either the load lock module LLM1 or the load lock module LLM2, the interior of each of the load lock module LLM1 and the load lock module LLM2 is kept in a preliminary vacuum atmosphere. Then, the substrate W is picked up by the transfer arm 131 and is transferred into the vacuum transfer chamber 13. Thereafter, the substrate W is transferred between the vacuum transfer chamber 13 and the processing modules PM1 to PM4 where the substrate W is subjected to the processing. The processed substrate W is accommodated in the transfer vessel C through a reverse path (excluding the alignment chamber 120a) of the path during the loading.

Hereinafter, a configuration of the plasma processing apparatus 10 according to an exemplary embodiment of the present disclosure will be described with reference to FIG. 3. The plasma processing apparatus 10 may be used to perform the method MT illustrated in FIG. 1. The plasma processing apparatus 10 may be used in any of the processing modules PM1 to PM4 of the processing system 1 illustrated in FIG. 2.

Figure 3:
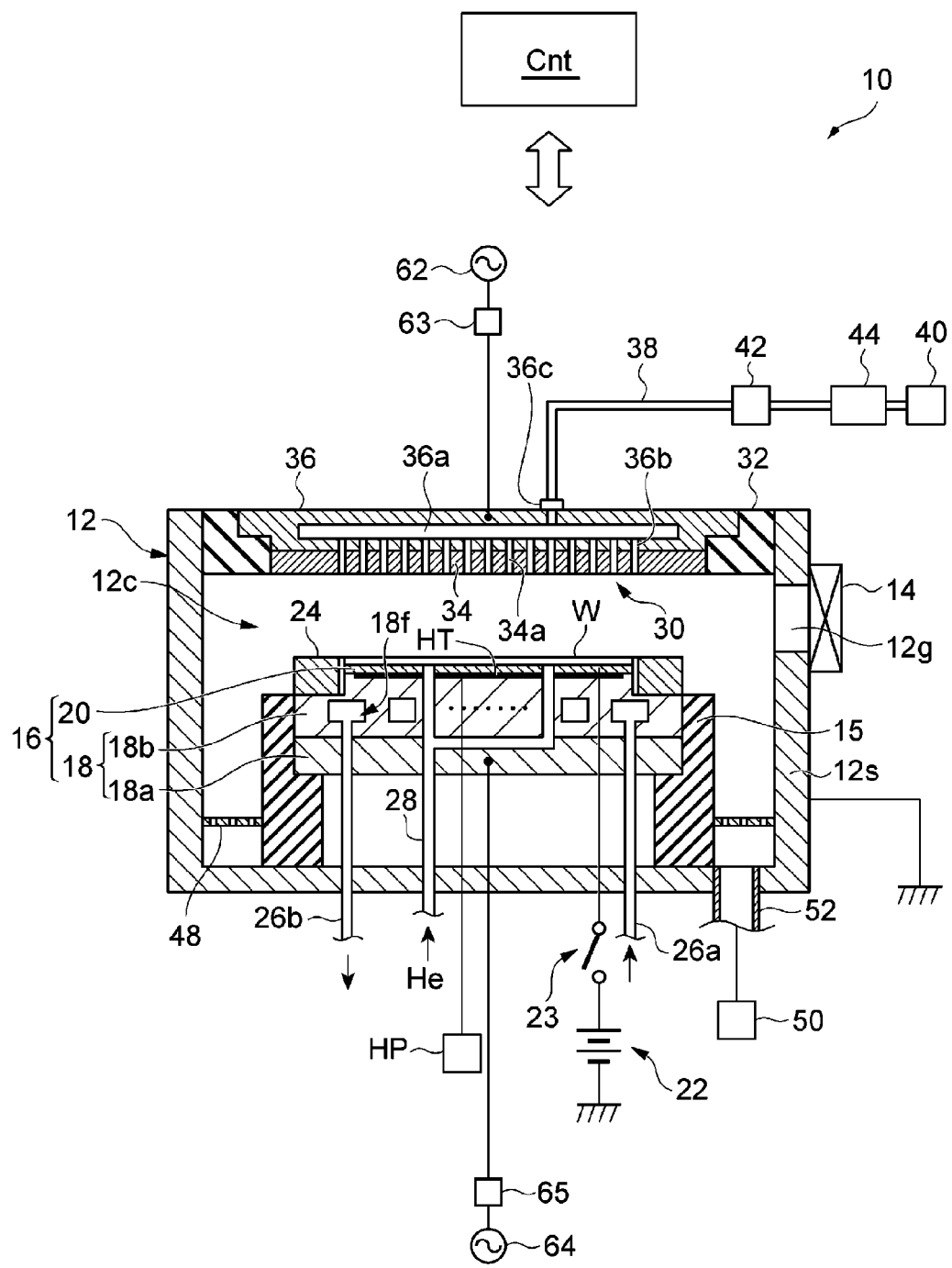
FIG. 3 is a view illustrating a plasma processing apparatus according to an exemplary embodiment of the present disclosure.

A structure of a vertical cross section of the plasma processing apparatus 10 is schematically illustrated in FIG. 3. The plasma processing apparatus 10 illustrated in FIG. 3 is a capacitively coupled plasma processing apparatus.

The plasma processing apparatus 10 may be used to perform an etching process and a film forming process. In this case, when the method MT includes the etching process and the film forming process, the etching process and the film forming process may be performed by a common single apparatus (the plasma processing apparatus 10). Furthermore, when the method MT includes the etching process and the film forming process, the etching process and the film forming process may be performed by separate processing apparatuses.

The plasma processing apparatus 10 includes a processing container 12. The processing container 12 accommodates a substrate W. The processing container 12 has a substantially cylindrical shape. The processing container 12 provides an internal space thereof as a chamber 12c. The processing container 12 is made of, for example, aluminum. The processing container 12 is connected to a ground potential.

A film having plasma resistance is formed on an inner wall surface of the processing container 12, i.e., on a wall surface defining the chamber 12c. This film may be a film formed by anodizing or a film made of ceramics. This film made of ceramics is, for example, a film containing yttrium oxide.

An opening 12g for transferring the substrate W therethrough is formed on a sidewall 12s of the processing container 12. The opening 12g can be opened and closed by a gate valve 14.

Inside the chamber 12c, a support part 15 extends upward from the bottom of the processing container 12. The support part 15 has a substantially cylindrical shape and has an insulating material such as quartz or the like.

A stage 16 is provided inside the chamber 12c. The stage 16 is configured to support the substrate W mounted on the stage 16.

The substrate W may have a disk shape like a wafer. The stage 16 includes a lower electrode 18 and an electrostatic chuck 20. The stage 16 is supported by the support part 15.

The lower electrode 18 includes a first plate 18a and a second plate 18b. The first plate 18a and the second plate 18b contain metal such as aluminum or the like, and have a substantially disk shape. The second plate 18b is provided on the first plate 18a and is electrically connected to the first plate 18a.

The electrostatic chuck 20 is provided on the second plate 18b. The electrostatic chuck 20 has an insulating layer and an electrode built in the insulating layer.

A direct current power supply 22 is electrically connected to an electrode of the electrostatic chuck 20 via a switch 23. When a direct current voltage from the direct current power supply 22 is applied to the electrode of the electrostatic chuck 20, the electrostatic chuck 20 generates an electrostatic force. The electrostatic chuck 20 attracts the substrate W to the electrostatic chuck 20 by virtue of the electrostatic force to hold the substrate W.

A focus ring 24 is arranged on a peripheral portion of the second plate 18b so as to surround an edge of the substrate W and the electrostatic chuck 20. The focus ring 24 is provided to improve the uniformity of plasma processing. The focus ring 24 has a material suitably selected according to the plasma processing, and has, for example, quartz.

The substrate W mounted on the electrostatic chuck 20 may be controlled by using a chiller unit for supplying a refrigerant to a flow path 18f and a heater power supply HP for supplying electric power to a temperature adjusting part HT.

The flow path 18f is provided inside the second plate 18b. The refrigerant is supplied from the chiller unit provided outside the processing container 12 to the flow path 18f via a pipe 26a. The refrigerant supplied to the flow path 18f is returned to the chiller unit via a pipe 26b. In this manner, the refrigerant is supplied to the flow path 18f so as to circulate in the flow path 18f. By controlling the temperature of the refrigerant by the chiller unit, the temperature of the substrate W supported by the electrostatic chuck 20 can be controlled.

The temperature adjusting part HT is provided on the electrostatic chuck 20. The heater power supply HP is connected to the temperature adjusting part HT. By supplying electric power from the heater power supply HP to the temperature adjusting part HT, the temperature of the electrostatic chuck 20 is adjusted so that the temperature of the substrate W mounted on the electrostatic chuck 20 is adjusted. The temperature adjusting part HT may also be embedded in the second plate 18b.

The temperature adjusting part HT includes a temperature sensor (not shown), which detects an ambient temperature of the temperature adjusting part HT and outputs the detection result as a detection signal to the controller Cnt. The temperature detected by the temperature sensor is equal to the temperature of the substrate W mounted on the electrostatic chuck 20.

A gas supply line 28 is provided in the plasma processing apparatus 10. The gas supply line 28 supplies a heat transfer gas from a heat transfer gas supply mechanism, for example, a He gas, between the upper surface of the electrostatic chuck 20 and the rear surface of the substrate W.

The plasma processing apparatus 10 further includes an upper electrode 30. The upper electrode 30 is provided above the stage 16 and is provided substantially parallel to the lower electrode 18. The upper electrode 30 closes an upper opening portion of the processing container 12 together with a member 32. The member 32 has an insulation property. The upper electrode 30 is supported on the upper portion of the processing container 12 via the member 32.

The upper electrode 30 includes a ceiling plate 34 and a support 36. The ceiling plate 34 faces the chamber 12c. A plurality of gas discharge holes 34a are formed in the ceiling plate 34. The ceiling plate 34 has, for example, silicon, but not limited thereto, and may have a structure in which a plasma-resistant film is formed on a surface of a base material made of aluminum. The film may also be a film made of ceramics. The film made of ceramics is a film formed by anodizing, a film containing yttrium oxide, or the like.

The support 36 detachably supports the ceiling plate 34. The support 36 has a conductive material such as aluminum or the like. A gas diffusion chamber 36a is provided inside the support 36.

A plurality of gas holes 36b extend downward from the gas diffusion chamber 36a. The plurality of gas holes 36b respectively communicate with the plurality of gas discharge holes 34a. A gas introduction port 36c for guiding a gas to the gas diffusion chamber 36a is formed in the support 36. A gas supply pipe 38 is connected to the gas introduction port 36c.

A gas source group 40 is connected to the gas supply pipe 38 via a valve group 42 and a flow rate controller group 44. The gas source group 40 has a plurality of gas sources. The plurality of gas sources include at least one or more noble gas sources, a hydrocarbon gas source, and an oxygen-containing gas source.

The noble gas sources may include an Ar gas source. The hydrocarbon gas source may include, for example, a $CH_4$ gas source. The oxygen-containing gas source may include, for example, an $O_2$ gas source.

The valve group 42 includes a plurality of valves. The flow rate controller group 44 includes a plurality of flow rate controllers such as a mass flow controller or the like. Each of the plurality of gas sources of the gas source group 40 is connected to the gas supply pipe 38 via a respective valve of the valve group 42 and a respective flow rate controller of the flow rate controller group 44.

The plasma processing apparatus 10 can supply a gas from one or more gas sources selected from the plurality of gas sources of the gas source group 40 to the chamber 12c at an individually-adjusted flow rate.

Inside the chamber 12c, a baffle plate 48 is provided between the support part 15 and the sidewall 12s of the processing container 12. The baffle plate 48 has, for example, a configuration in which a base material made of aluminum is coated with ceramics such as yttrium oxide or the like. A plurality of through-holes are formed in the baffle plate 48.

An exhaust pipe 52 is connected to the bottom of the processing container 12 below the baffle plate 48. An exhaust device 50 is connected to the exhaust pipe 52. The exhaust device 50 has a pressure controller and a vacuum pump such as a turbo molecular pump, and thus can depressurize the chamber 12c.

The plasma processing apparatus 10 includes a first high frequency power supply 62. The first high frequency power supply 62 is a power supply that generates a first high frequency for plasma generation, and generates a high frequency having a frequency in the range of 27 to 100 MHz, for example, a frequency of 60 MHz. The first high frequency power supply 62 is connected to the upper electrode 30 via a matching device 63.

The matching device 63 has a circuit for matching an output impedance of the first high frequency power supply 62 with an input impedance on the side of a load (the side of the upper electrode 30). The first high frequency power supply 62 may also be connected to the lower electrode 18 via the matching device 63. When the first high frequency power supply 62 is connected to the lower electrode 18, the upper electrode 30 is connected to the ground potential.

The plasma processing apparatus 10 includes a second high frequency power supply 64. The second high frequency power supply 64 is a power supply that generates a second high frequency for bias for drawing ions into the substrate W. The frequency of the second high frequency is lower than the frequency of the first high frequency.

The frequency of the second high frequency is a frequency in the range of 400 kHz to 13.56 MHz, for example, 400 kHz. The second high frequency power supply 64 is connected to the lower electrode 18 via a matching device 65.

The matching device 65 has a circuit for matching an output impedance of the second high frequency power supply 64 with an input impedance on the side of a load (the side of the lower electrode 18).

The controller Cnt of the plasma processing apparatus 10 is similar to the controller Cnt of the processing system 1. When the plasma processing apparatus 10 is any of the processing modules PM1 to PM4 of the processing system 1, the controller Cnt of the processing system 1 functions as the controller Cnt of the plasma processing apparatus 10.

Next, returning to FIG. 1, the method MT will be described. FIGS. 4, 5A to 5D, and 6 will be referred below. The method MT illustrated in FIG. 1 may be performed when the substrate W has a configuration illustrated in FIG. 5A.

Figure 5:
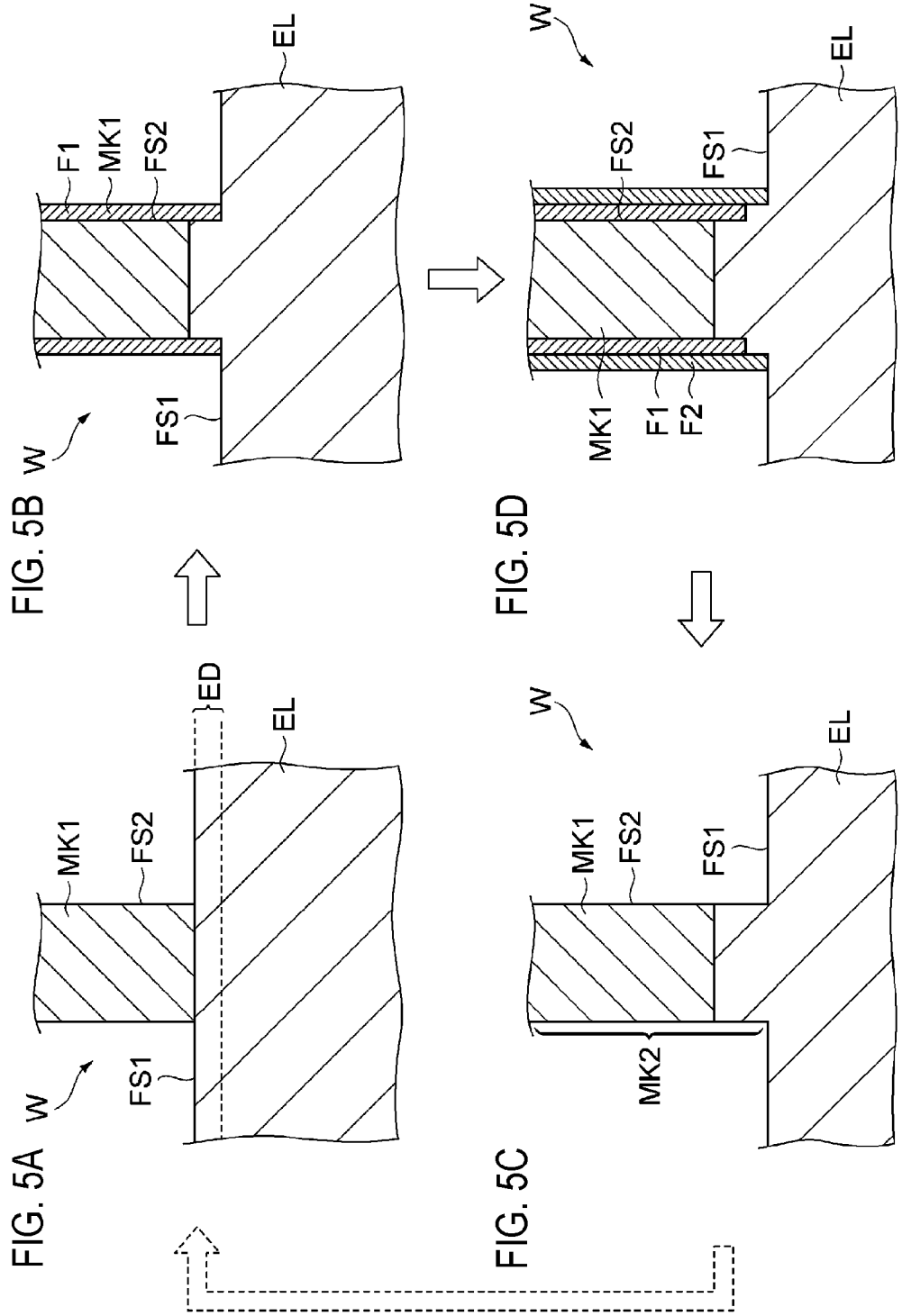
FIGS. 5A to 5D are views illustrating a flow of a process according to the method illustrated in FIG. 1 in a cross-sectional view of a substrate.

The substrate W illustrated in FIG. 5A includes an etching layer EL, a mask MK1, and the like (further, a mask MK2 or the like illustrated in FIG. 5D). The mask MK1 or the like is formed on a surface FS1 (a first surface) of the etching layer EL. A surface FS2 (a second surface) of the mask MK1 (further, the mask MK2 or the like) extends to the surface FS1.

Figure 6:
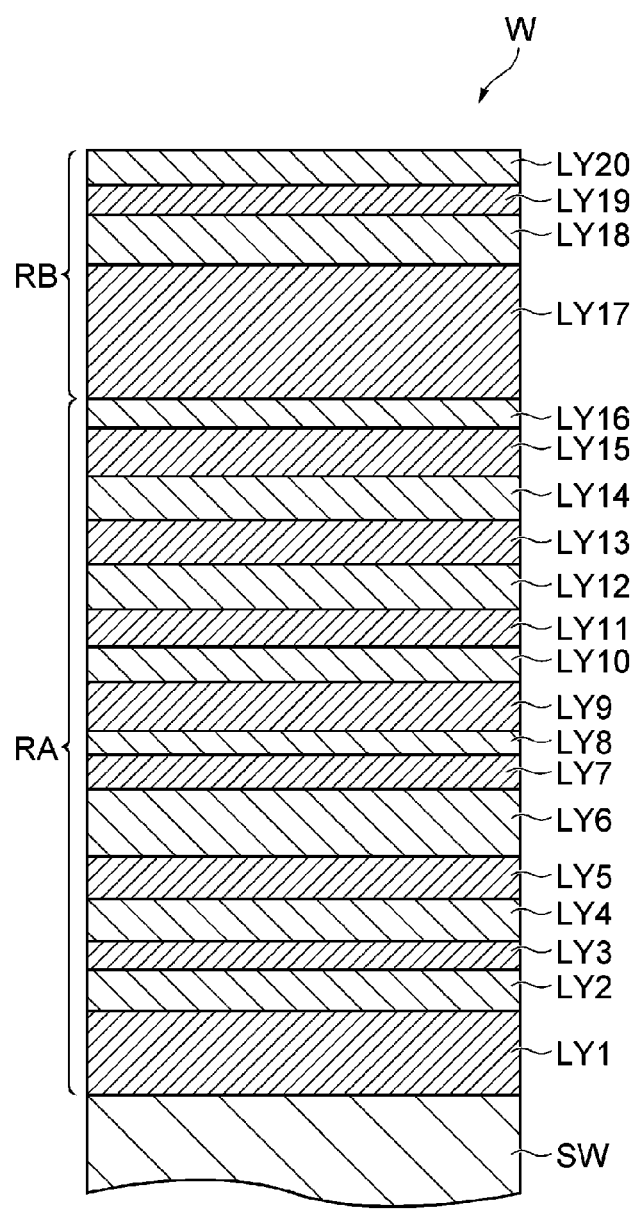
FIG. 6 is a view illustrating an example of a configuration of a substrate to which the method illustrated in FIG. 1 is applied.

In one exemplary embodiment, the substrate W having the configuration illustrated FIG. 5A is used for, for example, manufacturing a magnetoresistive random access memory (MRAM). In this case, as illustrated in FIG. 6, the substrate W may include a support substrate SW, a region RA, and a region RB. The region RA corresponds to the etching layer EL, and the region RB corresponds to the mask MK1. The etching layer EL has a magnetoresistive tunnel junction (MTJ) region.

The region RA is formed on the support substrate SW, and the region RB is formed on the region RA. The region RA includes layers LY1 to LY16, and the region RB includes layers LY17 to LY20. In the region RA, the layers LY1 to LY16 are sequentially laminated on the support substrate SW. In the region RB, the layers LY17 to LY20 are sequentially laminated on the region RA (on the layer LY16).

The support substrate SW has silicon (Si). The layer LY1 has silicon dioxide ($SiO_2$). The layer LY2 has tantalum (Ta). The layer LY3 has ruthenium (Ru). The layer LY4 has Ta. The layer LY5 is an underling layer having platinum (Pt). The layer LY6 is a magnetic layer having Pt/Co (where Co: cobalt). The layer LY7 has Co. The layer LY8 has Ru. The layer LY9 is a magnetic layer having Pt/Co.

The layer LY10 has Co. The layer LY11 has Ta. The layer LY12 has CoFeB (where Fe: iron, B: boron). The layer LY13 has magnesium oxide (MgO). The layer LY14 has CoFeB. The layer LY15 has Ta. The layer LY16 has Ru. The layer LY17 has titanium nitride (TiN). The layer LY18 has $SiO_2$. The layer LY19 has silicon carbide (SiC). The layer LY20 is a spin on glass (SOG) layer.

Figure 4:
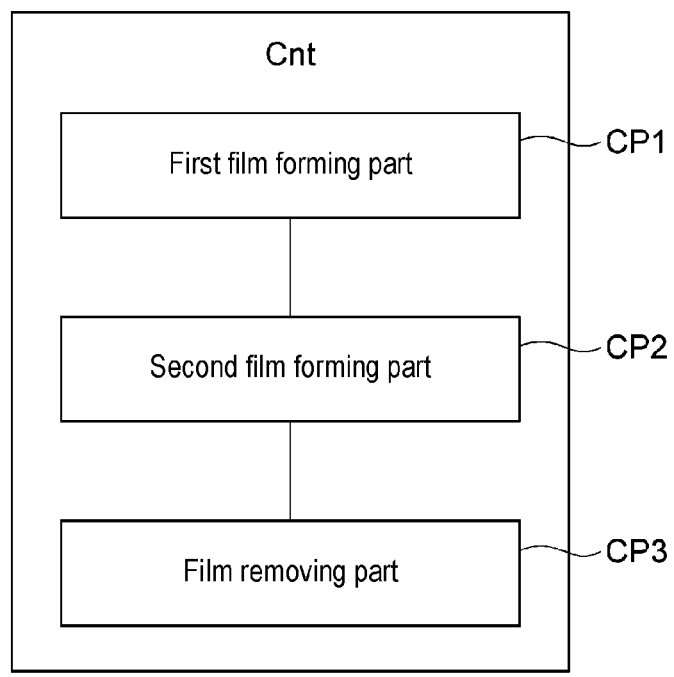
FIG. 4 is a diagram illustrating a function of a controller illustrated in each of FIGS. 2 and 3.

The controller Cnt which executes the method MT functionally includes a first film forming part CP1, a second film forming part CP2, and a film removing part CP3, as illustrated in FIG. 4. The first film forming part CP1, the second film forming part CP2, and the film removing part CP3 implement the execution of the method MT illustrated in FIG. 1.

Either when the method MT includes only the etching process or when the method MT includes the film forming process and the etching process, the first film forming part CP1, the second film forming part CP2, and the film removing part CP3 may be used. Either when the method MT includes only the etching process or when the method MT includes the film forming process and the etching process, only a single plasma processing apparatus 10 may be used.

Furthermore, when the method MT includes the film forming process and the etching process, each of the film forming process and the etching process may be performed by any of the processing modules PM1 to PM4 of the processing system 1. Each of the processing modules PM1 to PM4 includes a film forming apparatus and an etching apparatus. Either or both of the film forming apparatus and the etching apparatus may be the plasma processing apparatus 10.

Either when the method MT is performed by only the single plasma processing apparatus 10 or when the method MT is performed by the processing module PM1 or the like of the processing system 1, the method MT may be performed in a vacuum.

The method MT includes step ST1 (first step), step ST2 (second step), and step ST3 (third step). The first film forming part CP1 is configured to perform step ST1. The second film forming part CP2 is configured to perform step ST2. The film removing part CP3 is configured to perform step ST3.

In step ST1, as illustrated in FIG. 5B, a first film F1 is formed on the surface FS2 of the mask MK1. The first film F1 has an electrode material. The electrode material of the first film F1 has, for example, Ru or carbon (C).

When the etching layer EL includes an electrode material layer ED as illustrated FIG. 5A, the first film F1 may be formed by the etching process in step ST1. The material of the electrode material layer ED includes the electrode material of the first film F1. The electrode material layer ED extends to the surface FS1 of the etching layer EL. Step ST1 is executed on the substrate W accommodated in the processing container 12 of the plasma processing apparatus 10. In step ST1, the first film F1 is formed on the surface FS2 of the mask MK1 by etching the electrode material layer ED and sputtering the material of the electrode material layer ED.

When the etching layer EL includes an MTJ region, the electrode material layer ED is included in the MTJ region, and may be, for example, a Ru layer. When the electrode material layer ED is a Ru layer, the etching process executed in step ST1 may be reactive ion etching (RIE). A gas used for the etching process of RIE mainly includes a noble gas (for example, an Ar gas), but may include, for example, a $CH_4$ gas (further, an $O_2$ gas) together with the noble gas.

Furthermore, the first film F1 may be formed by the film forming process in step ST1. In this case, step ST1 is executed on the substrate W accommodated in the processing container 12 of the plasma processing apparatus 10 or in the processing container PS of the film forming apparatus (processing module PM1 or the like) of the processing system 1. In step ST1, the first film F1 is formed by chemical vapor deposition (CVD) or physical vapor deposition (PVD).

In step ST2, as illustrated in FIG. 5C, the surface FS1 of the etching layer EL is etched to form a second film F2 having the material of the etching layer EL on the first film F1. The second film F2 is formed by an etching process in step ST2.

When step ST1 is performed by the plasma processing apparatus 10, step ST2 is subsequently performed by the plasma processing apparatus 10 in which step ST1 has been performed. When step ST1 is performed by a film forming apparatus (processing module PM1 or the like) of the processing system 1, step ST2 is performed by an etching apparatus after the substrate W is transferred to the respective etching apparatus (processing module PM2 or the like) of the processing system 1.

In step ST2, when the etching process is performed in step ST1, the etching process performed in step ST1 may be continued. That is, the etching process performed in step ST2 may be RIE. The gas used for the etching process of RIE mainly includes a noble gas (for example, an Ar gas), but may include, for example, a $CH_4$ gas (further, an $O_2$ gas) together with the noble gas.

In step ST3, as illustrated in FIG. 5D, the first film F1 and the second film F2 are removed from the surface of the substrate W including the surface FS1 and the surface FS2 by exposing the substrate W after step ST2 to plasma of a processing gas. By step ST3, the mask MK2 including the mask MK1 is formed. The mask MK2 extends to the surface FS1 of the etching layer EL after step ST3. The mask MK2 can function as a new mask for the etching layer EL.

The processing gas used in step ST3 may include oxygen (O). The processing gas may include oxygen and include a noble gas (an Ar gas or the like).

According to the method MT, when the substrate W is exposed to the plasma of the processing gas containing oxygen, the first film F1 of the electrode material such as Ru or the like may be appropriately delaminated from the surface FS2 of the mask MK1 together with the second film F2 deposited on the first film F1 and having the material of the etching layer EL. Therefore, in the etching of the etching layer EL, the change in CD having the shape of the mask MK1 or the like can be sufficiently suppressed while sufficiently maintaining the residual film of the mask MK1 or the like. Thus, it is possible to avoid a situation in which the film containing the material of the etching layer EL is formed on the surface FS2 of the mask MK1 by the etching of the etching layer EL, which makes fine etching processing difficult.

Furthermore, it may be considered that the electrode material layer ED extends to the surface FS1 of the etching layer EL. In this case, the formation of the first film F1 of the electrode material is performed by the etching of the etching layer EL, and the etching of the etching layer EL and the formation of the first film F1 are performed together in step ST1 by the first film forming part CP1. Thus, it is possible to simplify the processing.

In addition, when the first film F1 is formed by the film forming process based on the chemical vapor deposition or the physical vapor deposition, the timing of formation of the first film F1 may be relatively flexibly adjusted.

Moreover, in one exemplary embodiment, step ST1, step ST2, and step ST3 may be repeatedly executed. In this case, the maintenance of the mask residual film and the suppression of the change in the CD of mask shape can be more remarkably realized.

Furthermore, in one exemplary embodiment, the method MT may be used to, for example, etch an etching layer EL having an MTJ region including a film of a hard-to-volatile material. In this case, a mask residual film of 40 nm or more and a CD having a mask shape of 40 nm or less can be sufficiently realized. As described above, the MTJ region has a hard-to-volatile material, but the method MT may be applied to the etching layer having the MTJ region of the hard-to-volatile material in this way.

Furthermore, since the electrode material of Ru or C can be used for the first film F1, the formation of the first film F1 can be relatively easily performed. For example, when the etching layer EL includes an MTJ junction region, the MTJ region includes a Ru layer. Therefore, the formation of the first film F1 can be more easily performed by using Ru of the Ru layer.

It may be considered that the etching layer EL includes a plurality of electrode material layers ED (the layer LY3 having Ru, the layer LY8, the layer LY16) arranged apart from each other as in the configuration of the substrate W illustrated in FIG. 6. In this case, step ST1, step ST2, and step ST3 may be repeatedly executed using the plurality of electrode material layers ED. In this case, in step ST1, the first film F1 is formed by an etching process on the electrode material layer ED. It may also be considered that the method MT includes both step ST1 of forming the first film F1 by the etching process and step ST1 of forming the first film F1 by the film forming process.

Although various exemplary embodiments have been described above, various omissions, substitutions, and modifications may be made without being limited to the aforementioned exemplary embodiments. Also, elements in different embodiments may be combined to form different embodiments.

From the foregoing, it should be understood that various embodiments of the present disclosure have been described herein for purposes of illustration, and that various modifications can be made without departing from the scope and spirit of the present disclosure. Accordingly, the various exemplary embodiments disclosed herein are not intended to be limiting, and the true scope and spirit thereof are represented by the appended claims.

EXPLANATION OF REFERENCE NUMERALS

1: processing system, 10: plasma processing apparatus, 11: carrier mounting port, 12: processing container, 120: atmospheric transfer chamber, 120a: alignment chamber, 121: transfer arm, 12c: chamber, 12g: opening, 12s: sidewall, 13: vacuum transfer chamber, 131: transfer arm, 14: gate valve, 15: support part, 16: stage, 18: lower electrode, 18a: first plate, 18b: second plate, 18f: flow path, 20: electrostatic chuck, 22: direct current power supply, 23: switch, 24: focus ring, 26a: pipe, 26b: pipe, 28: gas supply line, 30: upper electrode, 32: member, 34: ceiling plate, 34a: gas discharge hole, 36: support, 36a: gas diffusion chamber, 36b: gas hole, 36c: gas introduction port, 38: gas supply pipe, 40: gas source group, 42: valve group, 44: flow rate controller group, 48: baffle plate, 50: exhaust device, 52: exhaust pipe, 62: first high frequency power supply, 63: matching device, 64: second high frequency power supply, 65: matching device, C: transfer vessel, Cnt: controller, CP1: first film forming part, CP2: second film forming part, CP3: film removing part, ED: electrode material layer, EL: etching layer, FS1: surface, FS2: surface, F1: first film, F2: second film, G1: door, G2: door valve, G3: gate valve, G4: gate valve, HP: heater power supply, HT: temperature adjusting part, LLM1: load lock module, LLM2: load lock module, LS: stage, LY1 to LY20: layer, MK1: mask, MK2: mask, MT: method, PM1: processing module, PM2: processing module, PM3: processing module, PM4: processing module, PS: processing container, RA: region, RB: region, SW: support substrate, W: substrate

What is claimed is:

1. A method of processing a substrate, wherein the substrate includes an etching layer and a mask, and the mask is formed on a first surface of the etching layer, the method comprising:
a first step of forming a first film on a second surface of the mask;
a second step of forming a second film having a material of the etching layer on the first film by etching the first surface of the etching layer; and
a third step of removing the first film and the second film by exposing the substrate after the second step to plasma of a processing gas,
wherein the first film has an electrode material, and the processing gas includes oxygen.

2. The method of claim 1, wherein the etching layer includes an electrode material layer, and the electrode material layer extends to the first surface, and
wherein in the first step, the first film is formed by etching the electrode material layer and sputtering the material of the electrode material layer.

3. The method of claim 1, wherein in the first step, the first film is formed by a chemical vapor deposition or a physical vapor deposition.

4. The method of claim 1, wherein a series of steps of the first step, the second step, and the third step are repeatedly executed.

5. The method of claim 1, wherein the etching layer includes a magnetic tunnel junction region.

6. The method of claim 1, wherein the first film has an electrode material of ruthenium or carbon.

7. A substrate processing apparatus, comprising:
a processing container configured to accommodate a substrate; and
a controller configured to control the substrate processing apparatus,
wherein the controller includes:
a first film forming part configured to control the substrate processing apparatus so as to form a first film having an electrode material on a second surface of a mask when the substrate accommodated in the processing container includes an etching layer and the mask and the mask is formed on a first surface of the etching layer;
a second film forming part configured to control the substrate processing apparatus so as to form a second film having the material of the etching layer on the first film by etching the first surface of the etching layer after the formation of the first film by the first film forming part; and
a film removing part configured to control the substrate processing apparatus so as to remove the first film and the second film by exposing the substrate on which the second film is formed by the second film forming part to plasma of a processing gas including oxygen.

8. The substrate processing apparatus of claim 7, wherein when the etching layer includes an electrode material layer and the electrode material layer extends to the first surface, the first film forming part is configured to control the substrate processing apparatus so as to form the first film by etching the electrode material layer and sputtering the material of the electrode material layer.

9. A processing system for processing a substrate, comprising:
a film forming apparatus configured to perform a film forming process on the substrate;
an etching apparatus configured to perform an etching process on the substrate; and
a controller configured to control the processing system,
wherein the controller includes:
a first film forming part configured to control the processing system so as to form a first film having an electrode material on a second surface of a mask when the substrate accommodated in the processing container includes an etching layer and the mask and the mask is formed on a first surface of the etching layer;
a second film forming part configured to control the processing system so as to form a second film having the material of the etching layer on the first film by transferring the substrate to the etching apparatus and etching the first surface of the etching layer after the formation of the first film by the first film forming part; and
a film removing part configured to control the processing system so as to remove the first film and the second film by exposing the substrate on which the second film is formed by the second film forming part to plasma of a processing gas including oxygen.

10. The processing system of claim 9, wherein the first film forming part is configured to control the processing system so as to form the first film by a chemical vapor deposition or a physical vapor deposition.

* * * * *